(12) United States Patent
Akahori

(10) Patent No.: US 8,278,750 B2
(45) Date of Patent: Oct. 2, 2012

(54) HEAT CONDUCTION BOARD AND MOUNTING METHOD OF ELECTRONIC COMPONENTS

(75) Inventor: Hideki Akahori, Shizuoka (JP)

(73) Assignee: NEC Access Technica, Ltd, Shizuoka (JP)

( * ) Notice: Subject to any disclaimer, the term of this patent is extended or adjusted under 35 U.S.C. 154(b) by 178 days.

(21) Appl. No.: 12/820,611

(22) Filed: Jun. 22, 2010

(65) Prior Publication Data

US 2011/0116236 A1   May 19, 2011

(30) Foreign Application Priority Data

Nov. 19, 2009   (JP) ................. 2009-263897

(51) Int. Cl.
*H01L 23/10*   (2006.01)
*H01L 23/34*   (2006.01)

(52) U.S. Cl. .......... 257/706; 257/672; 361/704

(58) Field of Classification Search .......... 257/672, 257/706; 438/118, 122; 361/704
See application file for complete search history.

(56) References Cited

U.S. PATENT DOCUMENTS

| | | | | |
|---|---|---|---|---|
| 5,942,797 | A * | 8/1999 | Terasawa | 257/723 |
| 7,061,080 | B2 * | 6/2006 | Jeun et al. | 257/676 |
| 7,405,467 | B2 * | 7/2008 | Liu et al. | 257/672 |
| 2001/0052639 | A1 * | 12/2001 | Jeon et al. | 257/678 |
| 2003/0057573 | A1 * | 3/2003 | Sekine et al. | 257/787 |

FOREIGN PATENT DOCUMENTS

| | | |
|---|---|---|
| JP | 4-93159 U | 8/1992 |
| JP | 8-130282 A | 5/1996 |
| JP | 11-233712 A | 8/1999 |
| JP | 2008021819 A | 1/2008 |
| JP | 2008210920 A | 9/2008 |
| JP | 2008243970 A | 10/2008 |

OTHER PUBLICATIONS

Japanese Office Action for JP2009-263897 issued Oct. 18, 2011.

* cited by examiner

*Primary Examiner* — Phuc Dang

(57) ABSTRACT

A heat conduction board, include a heat dissipation member; a heat conduction member which is arranged on the heat dissipation member and conducts a heat thereto; a lead frame which is formed in a wire pattern shape, and is arranged on the heat conduction member; and a printed circuit board which mounts a second electronic component for controlling a first electronic component; wherein the first electronic component and the printed circuit board are soldered to the lead frame.

3 Claims, 8 Drawing Sheets

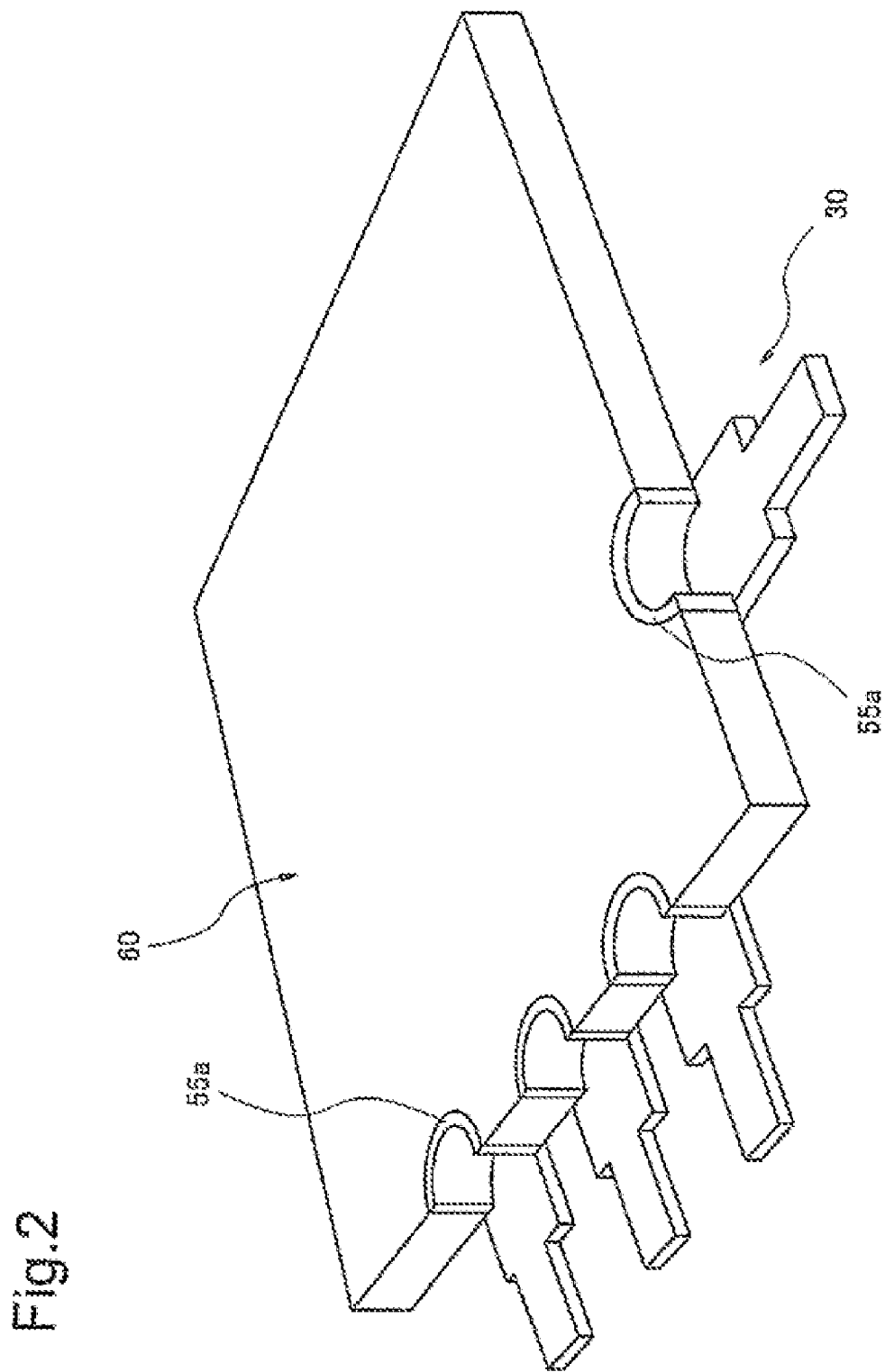

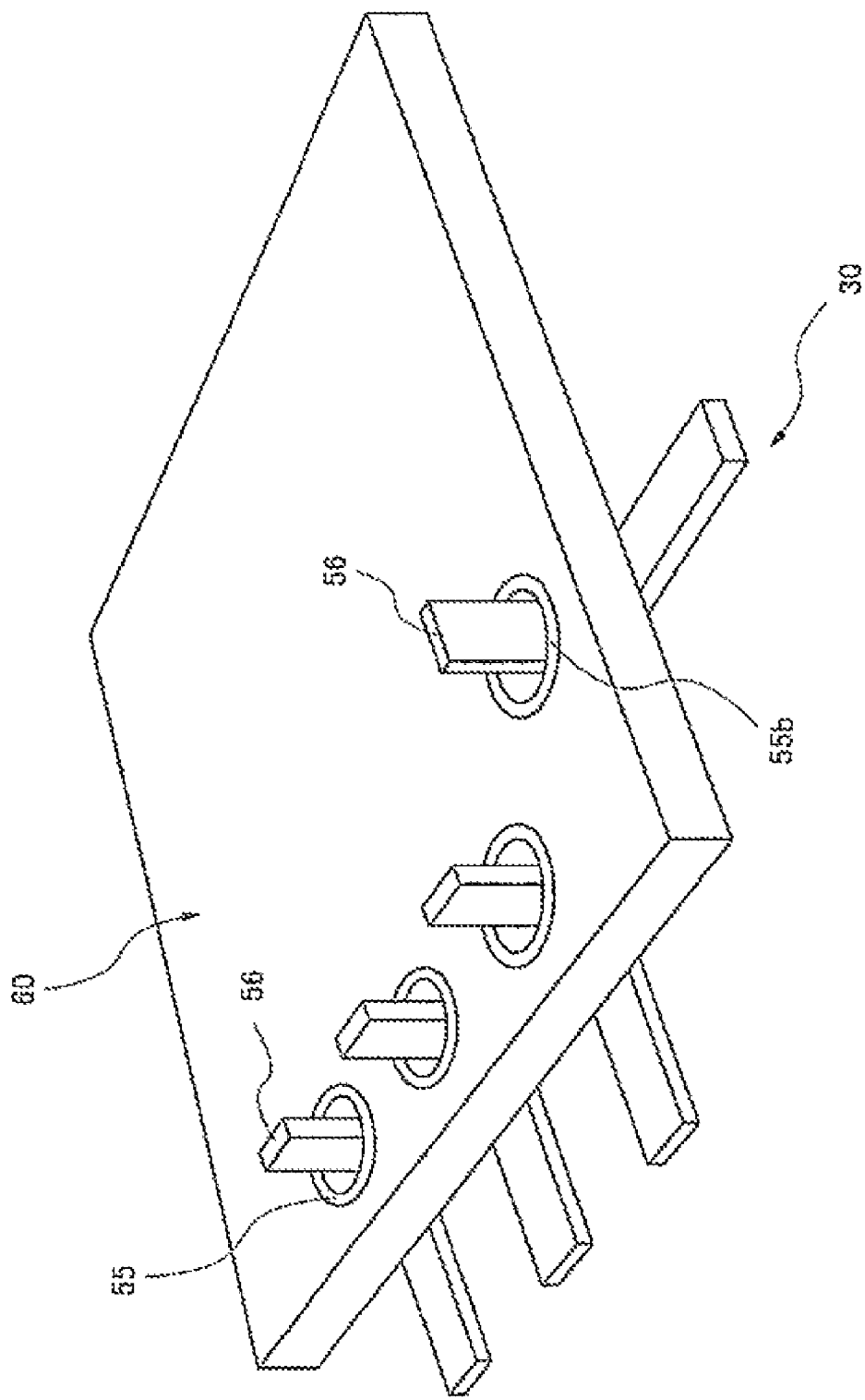

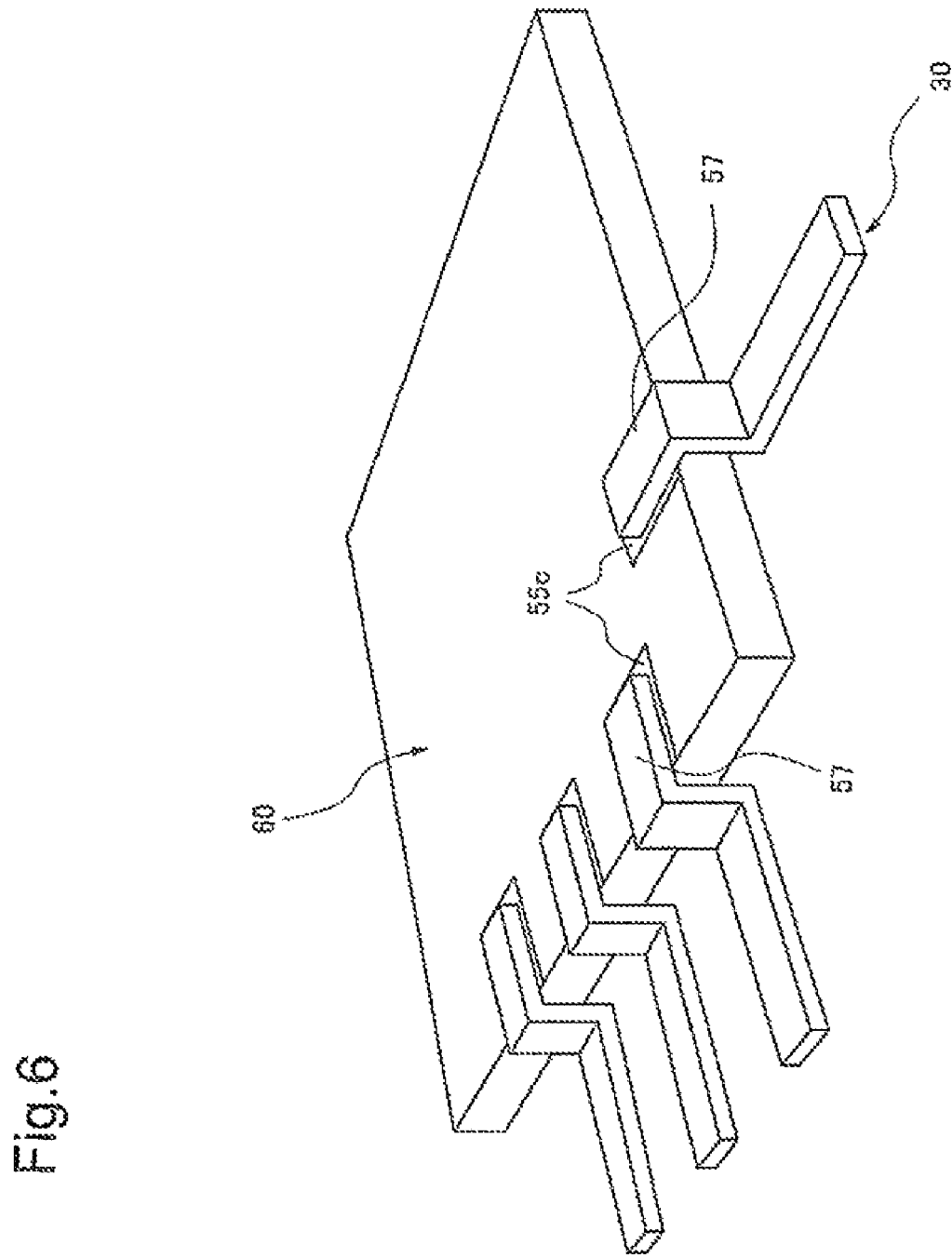

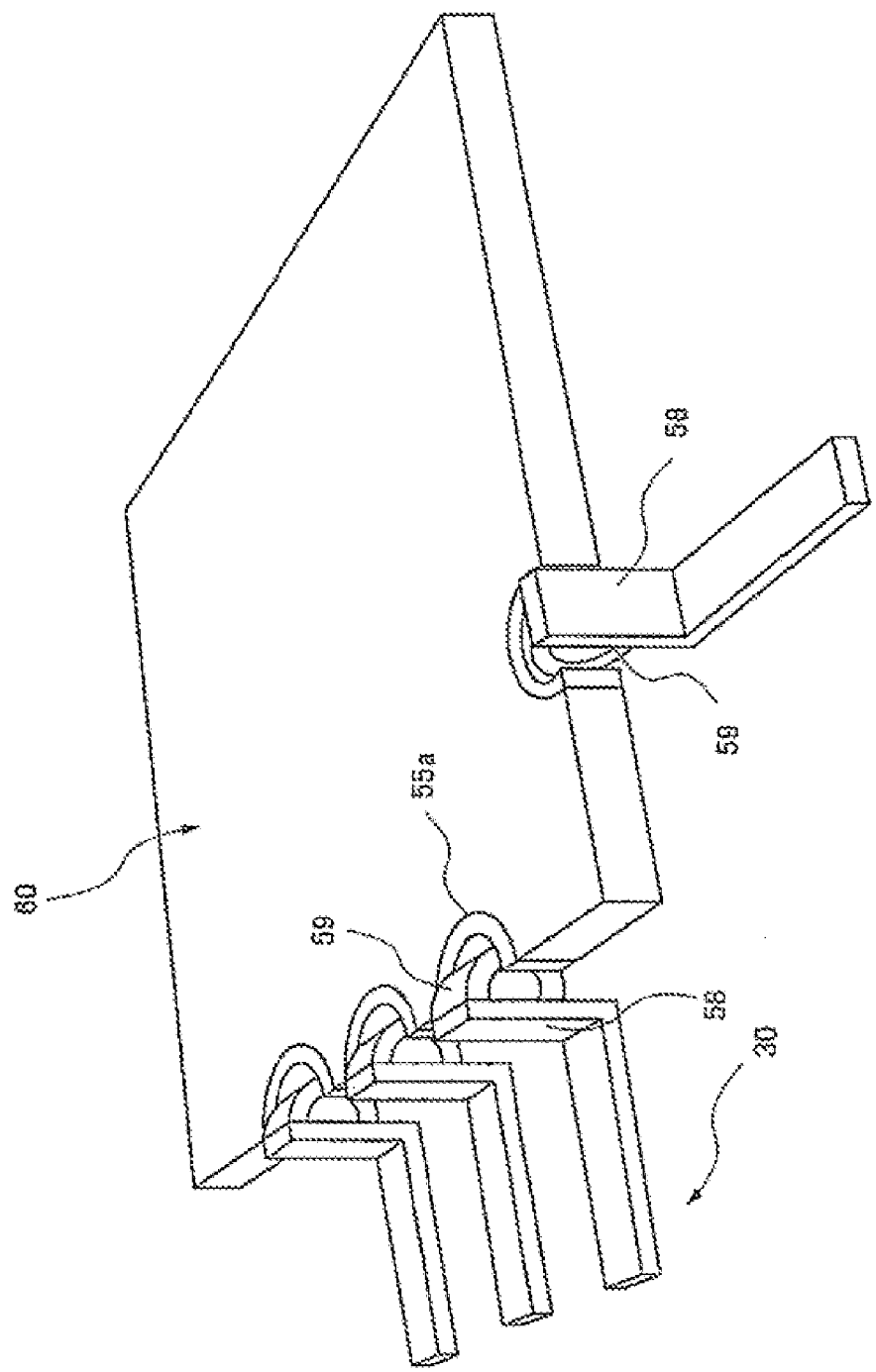

HEAT CONDUCTION BOARD AND MOUNTING METHOD OF ELECTRONIC COMPONENTS

INCORPORATION BY REFERENCE

This application is based upon and claims the benefit of priority from Japanese Patent Application No. 2009-263897, filed on Nov. 19, 2009, and the disclosure of which is incorporated herein in its entirety by reference.

BACKGROUND OF THE INVENTION

1. Technical Field

The present invention relates to a heat conduction board and a mounting method of electronic components.

2. Background Art

In recent years, high efficiency and high density mounting for electronic components, such as a semiconductor device, are required for high performance and miniaturization of an electronic apparatus, and miniaturization and high density mounting for a circuit board which mounts various kinds of the electronic components are required. Then, a development of a module which unified a power semiconductor device, such as a switching device, and a control circuit which controls it, and advanced radiation property is performed.

Japanese Patent. Application Laid-Open No. 11-233712 discloses an electronic apparatus that a power semiconductor device, and a printed circuit board which has arranged control circuits with high density are mounted respectively on lead frames. These lead frames are arranged on a heat sink on both sides of a resin layer, and is covered by using a resin. A power semiconductor device and the printed circuit board which mounts on the lead frame are electrically connected using conductive wires.

Japanese Patent Application Laid-Open No. 2008-21819 discloses an electronic apparatus provided with a metal plate with opening, a heat conduction resin layer, a lead frame, a power device and a control part. The lead frame is arranged on the resin layer which is arranged on the metal plate. The power device is arranged on the lead frame and is electrically connected therewith. Therefore, the resin layer and the lead frame are located between the power device and the metal plate. The control part is mounted on a printed circuit board, and is arranged at the opening of the metal plate. Therefore, the printed circuit board and the resin layer are located between the control part and the lead frame. At this time, the printed circuit board is electrically connected with the lead frame by a number of pins which passes through the resin layer. Thereby, the wire length which connects with the power device and the control part becomes short, and the influence of noise decreases.

Moreover, Japanese Patent Application Laid-Open No. 2008-210920 discloses a circuit module provided with a metal plate, a heat conduction layer, a lead frame, a printed circuit board, a power system electronic component and a signal system electronic component. The heat conduction layer, the lead frame, and the printed circuit board are arranged on the metal plate in this order. The printed circuit board is provided with a number of openings. The lead frame located in the opening makes a same surface as a mounting surface of the printed circuit board. And the power system electronic component which needs heat dissipation and mounts at the lead frame side, and the signal system electronic component which needs high density mounting and mounts at the printed circuit board side. Thereby the wire length which connects the power system electronic component and the signal system electronic component becomes short, and the influence of noise is reduced.

However, Japanese Patent Application Laid-Open No. 11-233712 has a disadvantage to which a paste resin and a wire-bonding process are required, and the influence of noise becomes severe, since a wire length which connects the electronic component of the power system and the electronic component of the signal system becomes long. On the other hand, Japanese Patent Application Laid-Open No. 2008-21819 and Japanese Patent Application Laid-Open No. 2008-210920 have advantage to which the wire length becomes short, since the electronic components of the both system are directly mounted on the lead frame so that the almost same surface may be formed. Therefore, the influence of noise is reduced. However, since the electronic apparatus of Japanese Patent Application Laid-Open No. 2008-21819 and Japanese Patent Application Laid-Open No. 2008-210920 can mount an electronic component only in one surface of a printed circuit board, high density mounting of an electronic component cannot be performed.

SUMMARY

A main object of the present invention reduces an influence of noise without needing and a wire-bonding process for mounting of electronic components, and achieves high density mounting and high performance of a circuit board which mounts various kinds of electronic components.

A heat conduction board, include a heat dissipation member; a heat conduction member which is arranged on the heat dissipation member and conducts a heat thereto; a lead frame which is formed in a wire pattern shape, and is arranged on the heat conduction member; and a printed circuit board which mounts a second electronic component for controlling a first electronic component; wherein the first electronic component and the printed circuit board are soldered to the lead frame.

BRIEF DESCRIPTION OF THE DRAWINGS

Exemplary features and advantages of the present invention will become apparent from the following detailed description when taken with the accompanying drawings in which:

FIG. 2 is a perspective view of the heat conduction board according to the first exemplary embodiment.

FIG. 5 is a perspective view of another heat conduction board according to the first exemplary embodiment, FIG. 6 is a perspective view of another heat conduction board according to the first exemplary embodiment, FIG. 7 is a perspective view of another heat conduction board according to the first exemplary embodiment.

EXEMPLARY EMBODIMENT

In a present invention, a power semiconductor device (first electronic component) and a printed circuit board which mounted the control circuit (second electronic component) for controlling the power semiconductor device are directly soldered to a lead frame, without using a wire-bonding process. The semiconductor device is not bare mounting goods, and is packed.

<The First Exemplary Embodiment>

Figure 1A:
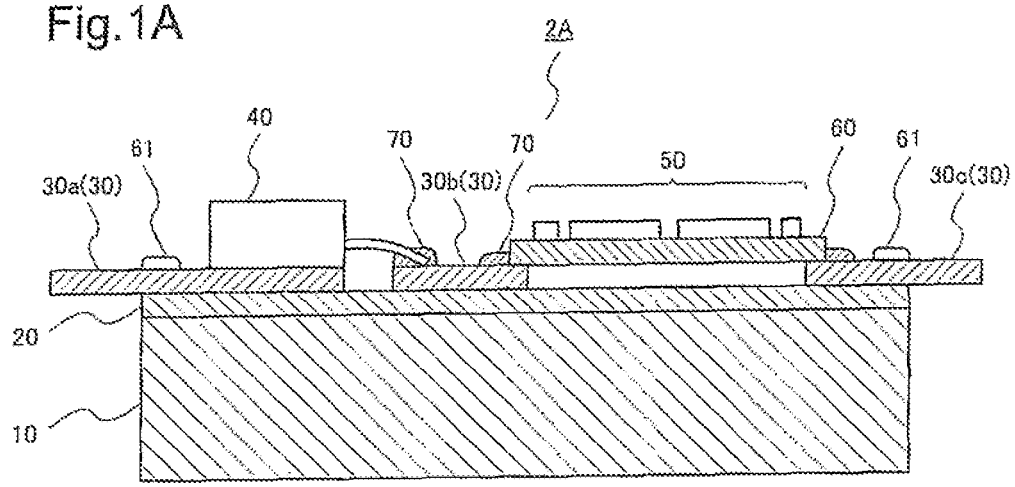
FIG. 1A is a sectional view of a heat conduction board of a first exemplary embodiment according to the present invention.
Figure 1B:
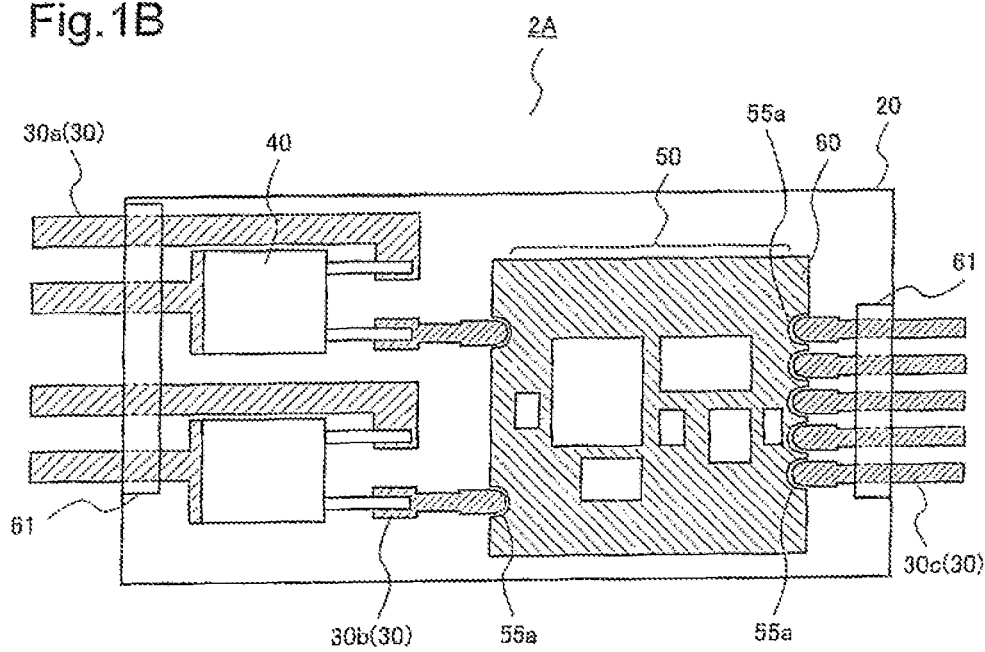
FIG. 1B is a top view of the heat conduction board of FIG. 1A.

Hereafter, a first exemplary embodiment of the present invention is explained. FIG. 1A is a sectional view of a heat conduction board of the first exemplary embodiment according to the present invention. FIG. 1B is a top view of the heat conduction board of FIG. 1A.

As shown in FIG. 1A, the heat conduction board 2 includes a metal plate 10, a resin layer 20 with electrical insulation property, a lead frame 30, a power semiconductor device 40, a control circuit 50, a printed circuit board 60 and a solder 70. The resin layer 20 is formed in a film shape on metal plate 10, and acts as a heat conduction layer which conducts the heat which generated in the power semiconductor device 40 to the metal plate 10. The heat radiates heat from the metal plate to the atmosphere etc. The lead frame 30 is arranged on the metal plate 10 on both sides of the resin layer 20, in order to connect electrically the power semiconductor device 40 and the printed circuit board 60 which mounted the control circuit 50, without using a conductive wire. At this time, the resin layer 20 has adhesiveness acts as adhesives which hold the lead frames 30 to the metal plate 10. The power semiconductor device 40 and the printed circuit board 60 are arranged on the lead frames 30, and are directly connected with the lead frames 30 by using the solder 70. The solder resist used for soldering is not shown in FIG. 1A and FIG. 1B. In FIG. 1A and FIG. 1B, the example which has arranged control circuit 50 only on a front surface of the printed circuit board 60 is shown.

The power semiconductor device 40 is a switching device for driving a motor etc. The control circuit 50 is a circuit including a microcomputer, a peripheral circuit, etc., and controls the power semiconductor device 40. The power semiconductor device 40 is packed, and is soldered with the lead frame 30. In addition, a reason for mounting the control circuit 50 on the printed circuit board 60 is because high-density wiring unrealizable by a lead frame 30 is possible for the printed circuit board 60.

As shown in FIG. 1B, the lead frames 30 are formed in a wire pattern shape which includes large current capacity lead frame 30a of wide pattern width and small current capacity lead frames 30b and 30c of narrow pattern width to which small signals, such as the control signal between the control circuit 50 and the power semiconductor device 40, are transmitted. Hereafter, the large current capacity lead frame 30a and the small current capacity lead frames 30b and 30c are suitably described to be the lead frames 30. The lead frame is suitable for the large current capacity conductor, since a thickness of the wiring conductor thereof is several hundred μm.

As mentioned above, the power semiconductor device 40, and the printed circuit board 60 which mounted the control circuit 50 are connected to the lead frame 30. FIG. 2 is a perspective view of the printed circuit board 60 which includes semicircle-like contact terminals 55a at an edge part thereof. The contact terminals 55a and the lead frames 30 are connected using the solder which is not shown in FIG. 2.

Figure 3:
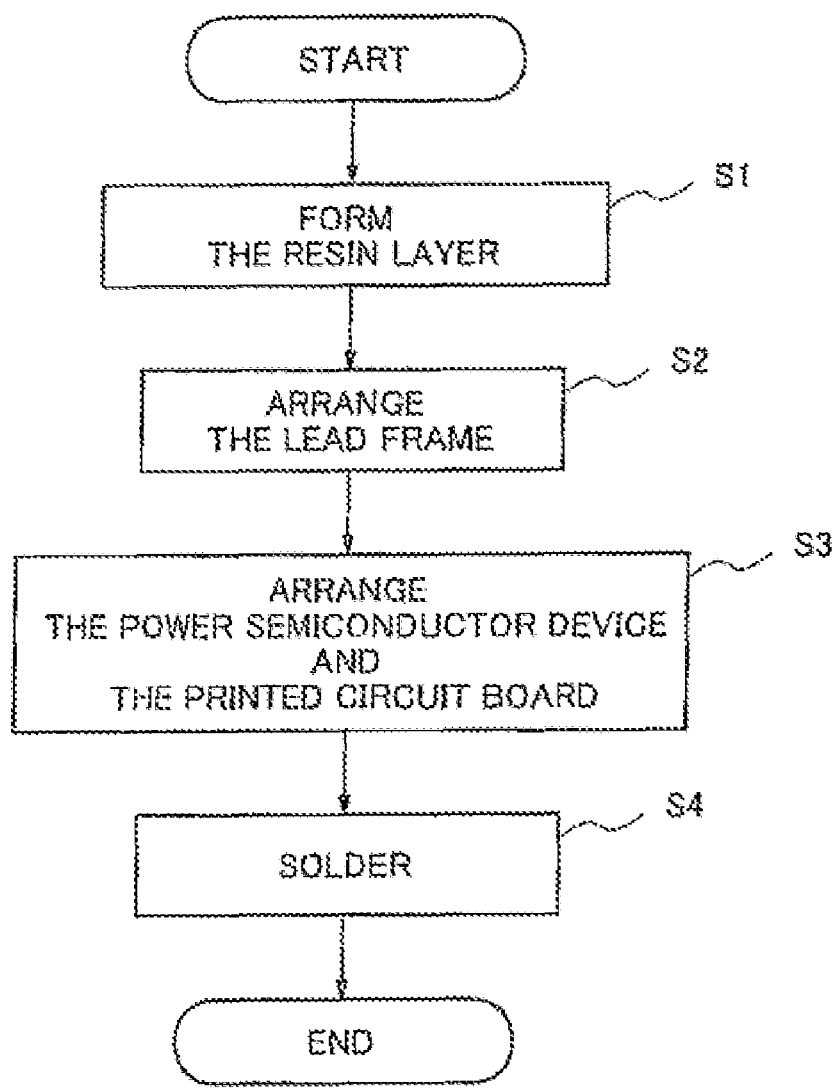
FIG. 3 is a flowchart of the mounting method.

A mounting method of the electronic component in such the heat conduction board 2A is explained. FIG. 3 is a flowchart which shows the mounting method of the electronic component.

Figure 4:
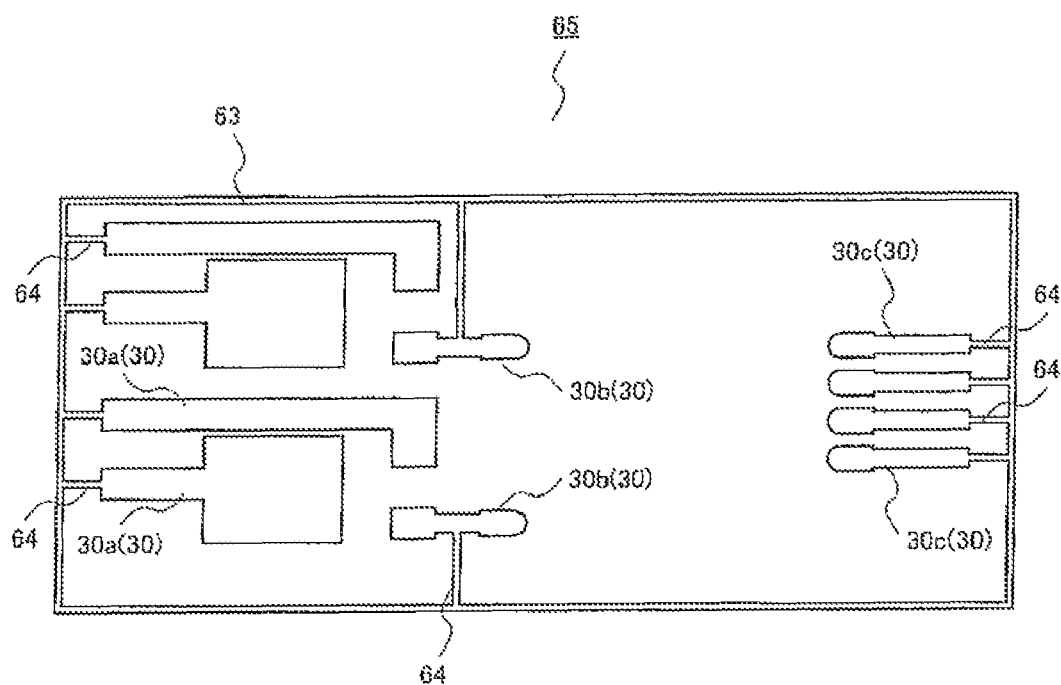
FIG. 4 is a top view of a lead frame unit.

First, the resin layer 20 is formed on the metal plate 10 (Step S1). Next, a lead frame 30 is arranged (Step S2). As shown in FIG. 4, the lead frame 30 is formed by using an etching technology or a punching technology. At this time, a support part 64 connects with a perimeter part 63 so that a plurality of lead frames 30 may not become separate. Hereinafter, the lead frame 30 connected with the support part 64 is described to be a lead frame unit 65.

After arranging the lead frame unit 65 on the resin layer 20, cutting tools, such as nippers, cut the boundary of a lead frame 30 and support part 64. If the support part 64 is cut by cutting tools, a burr may generate in a cutting plane. In such a case, when carrying out punching of the metal plate 10, the half cut of the boundary region of lead frame 30 and the support part 64 is carried out. Cutting with the lead frame 30 and the support part 64 can be carrying out only by bending the support part 64, without generating the burr.

After arranging the lead frame 30 on the resin layer 20, the power semiconductor device 40 and the printed circuit board 60 which mounted the control circuit 50 are arranged (Step S3). And the lead frame 30 and the connecting terminal 55a are soldered.

In addition, the method of connecting the lead frame 30 with the printed circuit board 60 etc. is not limited to the method shown in FIG. 2. For example, a method as shown in FIG. 5 is also possible. That is, a tip portion 56 of the lead frame 30 bent as a L-character shape is inserted into the contact terminal 55b of a through hole shape formed in a vicinity region at an end of the printed circuit board 60. In this method, an insertion state is not released easily, since the tip part 56 of the lead frame 30 is inserted into the contact terminal 55b. Therefore, it has an advantage which can perform reliable soldering easily. Moreover, not only a circle shape but an ellipse shape and a rectangular shape may be applicable as the shape of the contact terminal 55b.

As shown in FIG. 6, another method for connecting the lead frame 30 with the printed circuit board 60 etc. is possible. That is, pad-like contact terminals 55c are provided at the edge part of the printed circuit board 60, and a tip portion 57 of the lead frame 30 is bent as a Z-character shape. And the tip portion 57 is contacted with the contact terminal 55c, and is soldered. This method has an advantage that contact resistance becomes small, since the tip portion 57 and the contact terminal 55c carry out a surface contact.

As shown in FIG. 7, another method for connecting the lead frame 30 with the printed circuit board 60 etc. is possible. That is, semicircle-like contact terminals 55a are formed at the end part of the printed circuit board 60. A tip portion 58 of the lead frame 30 is bent as an L-character shape, and the semicircle-like bent side 59 is provided at the tip portion 58. And the bent side 59 is inserted into the contact terminal 55a and soldered. An insertion state is not released easily, since the bent side 59 of the lead frame 30 is inserted into the contact terminal 55a of the printed circuit board 60. Therefore, it has an advantage which can perform reliable soldering easily.

By using above the heat conduction board 2, a heat generated in the power semiconductor device 40 is conducted to the metal plate 10 through the resin layer 20. Therefore, since the metal plate 10 with high heat dissipation property acts as a heat sink, a temperature rise of whole the module is suppressed easily. By the way, it is possible to use a ceramics of a high thermal conductivity which carries out a role of the heat sink instead of the metal plate. Moreover, the control circuit 50 and the printed circuit board 60 may be covered with resin layer, and may be protected. FIG. 1A and FIG. 1B show the example which holds the lead frame 30 to the resin layer 20 using the holding part material 61. Therefore, the advantage which can suppress peeling of the lead frame 30 happens by the holding part material 61.

Thus, the power semiconductor device 40, and the printed circuit board 60 which mounted the control circuit 50 are directly soldered to the lead frame 30. Therefore, since a wire-bonding process becomes unnecessary, the manufacturing process of the heat conduction board 2 is shortened. Moreover, since the power semiconductor device 40 etc. is directly soldered to the lead frame 30, the influence of noise is reduced. Furthermore, since the power semiconductor device 40, and the printed circuit board 60 which mounted the control circuit 50 are mounted on the lead frame 30, high density mounting and high performance of the circuit board are achieved.

<Second Exemplary Embodiment>

Figure 8A:
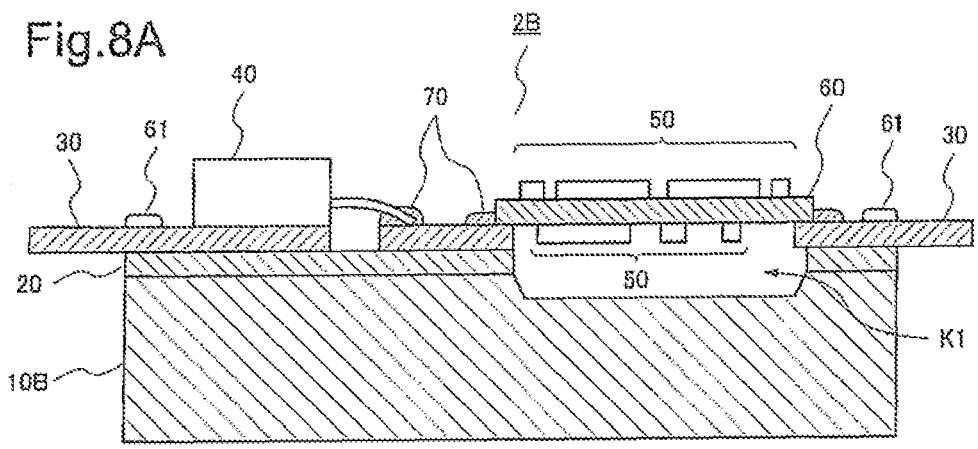
FIG. 8A is a sectional view of a heat conduction board of a second exemplary embodiment acceding to the present invention.
Figure 8B:
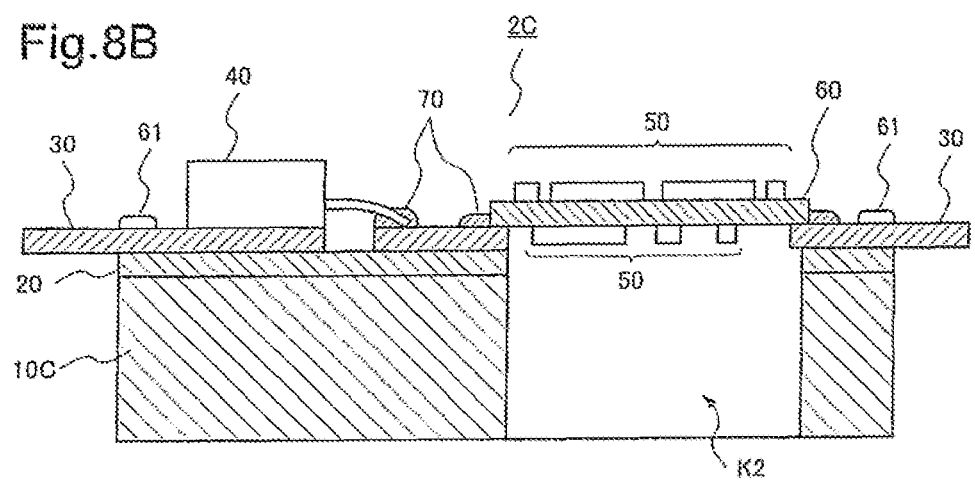
FIG. 8B is a sectional view of another heat conduction board according to the second exemplary embodiment.
Figure 8C:
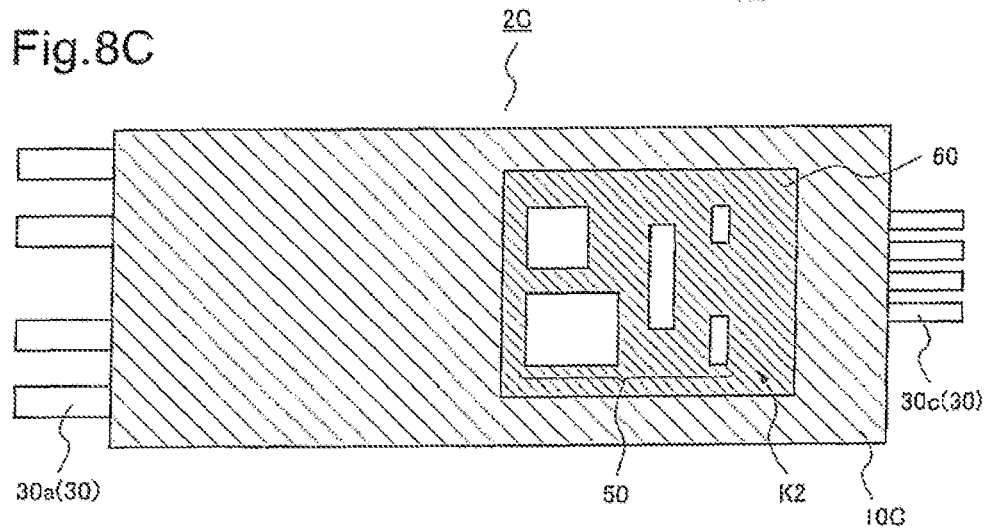
FIG. 8C is a bottom plan view of the heat conduction board of FIG. 8B.

A second exemplary embodiment of the present invention is explained. FIG. 8A is a sectional view of a heat conduction board 2B of the second exemplary embodiment according to the present invention. FIG. 8B is a sectional view of another heat conduction board 2C of the second exemplary embodiment according to the present invention. FIG. 8C is a bottom plan view of the heat conduction board 2C of FIG. 8B.

In this exemplary embodiment, in order that the control circuit 50 can be mounted on the front and back surfaces of the printed circuit board 60, predetermined spaces is formed in the metal plate. Interference with the metal plate and the control circuit which is mounted on the back surface of the printed circuit board is avoidable by this space. Thereby, high density mounting and high performance of the circuit board is achieved. Moreover, a heat amount that is conducted from the power semiconductor device 40 to the control circuit 50 is reduced, since a heat conducting path becomes long by this space. That is, temperature rise of the control circuit 50 is suppressed, and a semiconductor device which constitutes the control circuit 50 has an advantage which becomes difficult to receive a thermal influence.

In FIG. 8A, a concave portion K1 as the space which has the predetermined depth in a metal plate 10B is provided, and the resin layer 20 is arranged on the metal plate 10B. In FIG. 8B, a hole portion K2 as the space is provided in the metal plate 10C, and the resin layer 20 is arranged on the metal plate 10C. The printed circuit board 60 is mounted on the lead frame 30, and is connected thereto using the solder 70. A solder resist used for soldering is not shown in FIG. 8A, FIG. 8B, and FIG. 8C.

The heat conduction boards 2B and 2C can mount the printed circuit board 60 which arranged the control circuit 50 etc. on both sides. Furthermore, suppression of the temperature rise of whole the module, shortening of a manufacturing process and decrease of the influence of noise are accomplished.

In addition, in the range which does not deviate from the meaning of a present invention, various changes are possible for the scheme mentioned above. The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents. Further, it is noted that the inventor's intent is to retain all equivalents of the claimed invention even if the claims are amended during prosecution.

The invention claimed is:

1. A heat conduction board, comprising:
a heat dissipation member;
a heat conduction member which is arranged on the heat dissipation member and conducts a heat thereto;
a lead frame which is formed in a wire pattern shape, and is arranged on the heat conduction member; and
a printed circuit board which mounts a second electronic component for controlling a first electronic component, wherein:
the first electronic component and the printed circuit board are soldered to the lead frame,
the printed circuit board is provided with a contact terminal of a through hole shape, and
the lead frame is provided with a tip part of a L-character shape, wherein the tip part is inserted to the contact terminal and is soldered thereto.

2. A heat conduction board, comprising:
a heat dissipation member;
a heat conduction member which is arranged on the heat dissipation member and conducts a heat thereto;
a lead frame which is formed in a wire pattern shape, and is arranged on the heat conduction member; and
a printed circuit board which mounts a second electronic component for controlling a first electronic component, wherein:
the printed circuit board is provided with a contact terminal of a pad-like, and
the lead frame is provided with a tip part of a Z-character shape, wherein the tip part is surface contact with the contact terminal and is soldered thereto.

3. A heat conduction board, comprising:
a heat dissipation member;
a heat conduction member which is arranged on the heat dissipation member and conducts a heat thereto;
a lead frame which is formed in a wire pattern shape, and is arranged on the heat conduction member; and
a printed circuit board which mounts a second electronic component for controlling a first electronic component, wherein:
the printed circuit board is provided with a contact terminal of a semi-circle shape formed at a edge part, and
the lead frame is provided with a tip part of a L-character shape, wherein the tip part is inserted to the contact terminal and is soldered thereto.

* * * * *